(12) United States Patent
Park et al.

(10) Patent No.: US 8,193,637 B2
(45) Date of Patent: Jun. 5, 2012

(54) SEMICONDUCTOR PACKAGE AND MULTI-CHIP PACKAGE USING THE SAME

(75) Inventors: Myeong-soon Park, Seoul (KR);
Hyun-soo Chung, Hwaseong-si (KR);
Seok-ho Kim, Bucheon-si (KR);
Ki-hyuk Kim, Yongin-si (KR);
Chang-woo Shin, Gunpo-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 774 days.

(21) Appl. No.: 12/193,835

(22) Filed: Aug. 19, 2008

(65) Prior Publication Data
US 2009/0230548 A1    Sep. 17, 2009

(30) Foreign Application Priority Data
Mar. 12, 2008  (KR) .................. 10-2008-0023001

(51) Int. Cl.
*H01L 23/48*    (2006.01)

(52) U.S. Cl. ..................................... 257/737

(58) Field of Classification Search .................. 257/737
See application file for complete search history.

(56) References Cited

U.S. PATENT DOCUMENTS

| 6,380,615 | B1* | 4/2002 | Park et al. ................ 257/686 |
| 7,242,099 | B2 | 7/2007 | Lin et al. |
| 2004/0246126 | A1* | 12/2004 | Pitts ..................... 340/539.13 |
| 2008/0197469 | A1* | 8/2008 | Yang et al. .............. 257/686 |
| 2008/0246126 | A1* | 10/2008 | Bowles et al. ............ 257/659 |

FOREIGN PATENT DOCUMENTS

| JP | 2001-135776 |   | 5/2001 |
| KR | 1020050030736 | * | 4/2005 |
| KR | 2006-58954 |   | 6/2006 |
| KR | 20050030736 | * | 9/2006 |

\* cited by examiner

*Primary Examiner* — Steven Loke
*Assistant Examiner* — Kimberly M Thomas
(74) *Attorney, Agent, or Firm* — Stanzione & Kim, LLP

(57) ABSTRACT

A semiconductor package may have a semiconductor chip that includes a chip pad formed on a substrate including an integrated circuit, and a passivation layer exposing the chip pad, a first redistribution wiring layer that is connected to the chip pad and extends on the semiconductor chip and includes a wire bonding pad to provide wire bonding and a first solder pad to connect the first redistribution wiring layer to a second semiconductor chip, and a second redistribution wiring layer that is connected to the first redistribution wiring layer on the first redistribution wiring layer and includes a second solder pad to connect the second redistribution wiring layer to a third semiconductor chip.

25 Claims, 6 Drawing Sheets

SEMICONDUCTOR PACKAGE AND MULTI-CHIP PACKAGE USING THE SAME

CROSS-REFERENCE TO RELATED APPLICATIONS

This application claims the benefit of Korean Patent Application No. 10-2008-0023001, filed on Mar. 12, 2008 in the Korean Intellectual Property Office, the disclosure of which is incorporated herein in its entirety by reference.

BACKGROUND OF THE INVENTION

1. Field of the Invention

The present general inventive concept relates to a semiconductor package, and a multi-chip package using the semiconductor package.

2. Description of the Related Art

Today, the aim of the electronic industry is to manufacture semiconductor products that are light, compact, fast, multi-functional, and highly efficient with great reliability, at low costs. One of important methods that enable such a complex goal is semiconductor package assembly technology.

In particular, in order to provide a semiconductor package having high capacity, a multi-chip package in which semiconductor chips are stacked has been developed. The capacity of the multi-chip package can be easily increased according to the number of semiconductor chips with respect to an identical package area.

However, in the case of a multi-chip package in which a wiring substrate and semiconductor chips are used together with a bonding wire and a bump, an interposer chip has to be inserted between the semiconductor chips that are being stacked. When an interposer chip is inserted, the number of semiconductor chips that can be stacked in one multi-chip package is restricted, and the entire wiring length is increased, thus creating a lot of difficulties in terms of package design.

SUMMARY OF THE INVENTION

The present general inventive concept provides a semiconductor chip that is processed as a package at wafer level so as to be applied to a multi-chip package.

The present general inventive concept also provides a multi-chip package using the semiconductor package.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a semiconductor package which includes a semiconductor chip that includes a chip pad formed on a substrate including an integrated circuit, and a passivation layer exposing the chip pad. In the semiconductor package, a first redistribution wiring layer that is connected to the chip pad and extended on the semiconductor chip includes a wire bonding pad for wire bonding and a first solder pad for connecting the first redistribution wiring layer to a second semiconductor chip.

In the semiconductor package, a second redistribution wiring layer that is connected to the first redistribution wiring layer on the first redistribution wiring layer includes a second solder pad to connect the second redistribution wiring layer to a third semiconductor chip.

A redistribution wiring insulating layer that includes an opening portion exposing the chip pad for redistribution wiring may be formed between the passivation layer and the first redistribution wiring layer. A lower insulating layer exposing the wire bonding pad and the first solder pad may further formed on the first redistribution wiring layer. An upper insulating layer exposing the second solder pad may be further formed on the second redistribution wiring layer. The first redistribution wiring layer and the second redistribution wiring layer may be formed of Au layers. The chip pad may be formed in a center portion or a peripheral portion of the substrate.

The a semiconductor package may include a semiconductor chip that includes a chip pad formed on a substrate including an integrated circuit, and a passivation layer exposing the chip pad. A first redistribution wiring layer is connected to the chip pad and extended on the semiconductor chip.

A lower insulating layer is formed on the first redistribution wiring layer and includes a plurality of first opening portions exposing a portion of the first redistribution wiring layer. A second redistribution wiring layer is connected to the first redistribution wiring layer and is formed on the lower insulating layer. An upper insulating layer is formed on the second redistribution wiring layer and includes a plurality of second opening portions exposing a portion of the second redistribution wiring layer.

The first redistribution wiring layer exposed through the first opening portions may include a wire bonding pad for wire bonding and a first solder pad to connect the first redistribution wiring layer to a second semiconductor chip. The wire bonding pad may be formed in a peripheral portion of the semiconductor chip, and the first solder pad may be formed in a portion more central than the wire bonding pad.

The second redistribution wiring layer exposed through the second opening portions may be a second solder pad to connect the second redistribution wiring layer to the third semiconductor chip. The second solder pad may be formed more towards the peripheral portion of the semiconductor chip than the first solder pad and more central than the wire bonding pad.

The foregoing and/or other aspects and utilities of the present general inventive concept may also be achieved by providing a multi-chip package includes a wiring substrate. A semiconductor chip that is attached to the wiring substrate includes a chip pad formed on a substrate including an integrated circuit, and a passivation layer exposing the chip pad. A first redistribution wiring layer that is connected to the chip pad and extended on the semiconductor chip includes a wire bonding pad and a first solder pad. A bonding wire is connected the wire bonding pad of the first redistribution wiring layer and the wiring pad of the wiring substrate.

A second redistribution wiring layer that is connected to the first redistribution wiring layer above the first redistribution wiring layer has a second solder pad. A second semiconductor chip that is disposed above the semiconductor chip is connected to the semiconductor chip through a first bump that is disposed in a position corresponding to the first solder pad of the first redistribution wiring layer.

A third semiconductor chip disposed above the second semiconductor chip is connected to the second semiconductor chip through a second bump in a position corresponding to the second solder pad of the second redistribution wiring layer. An encapsulant seals (or encapsulates) the semiconductor chips, the redistribution wiring layers, and the bonding wire.

A redistribution wiring insulating layer including opening portions exposing the chip pad for redistribution wiring may be further formed between the passivation layer and the first redistribution wiring layer. A lower insulating layer may be further formed on the first redistribution wiring layer, which exposes the wire bonding pad and the first solder pad.

An upper insulating layer may be formed on the second redistribution wiring layer, which exposes the second solder pad. The sizes of the second and third semiconductor chips may be different from the size of the semiconductor chip.

The foregoing and/or other aspects and utilities of the present general inventive concept may also be achieved by providing a multi-chip package which includes a wiring substrate. A semiconductor chip includes a chip pad that is attached to the wiring substrate and includes an integrated circuit, and a passivation layer exposing the chip pad. A first redistribution wiring layer that is connected to the chip pad is extended on the semiconductor chip. A lower insulating layer that is formed on the first redistribution wiring layer forms a wire bonding pad and a first solder pad in a plurality of first opening portions which expose a portion of the first redistribution wiring layer.

A second redistribution wiring layer that is connected to the first redistribution wiring layer is formed on the lower insulating layer. An upper insulating layer that is formed on the second redistribution wiring layer forms a second solder pad in a plurality of opening portions which expose a portion of the second redistribution wiring layer. A bonding wire connects the wire bonding pad and a wiring pad of the wiring substrate.

A second semiconductor chip that is formed above the semiconductor chip is connected to the semiconductor chip through a first bump that is disposed in a position corresponding to the first solder pad. A third semiconductor chip that is disposed above the second semiconductor chip is connected to the second semiconductor chip through a second bump that is disposed in a position corresponding to the second solder pad. An encapsulant seals the semiconductor chips, the redistribution wiring layers, and the bonding wire.

The wire bonding pad may be in a peripheral portion of the semiconductor chip, and the first solder pad is more central than the wire bonding pad in the semiconductor chip. The chip pad may be formed in a center portion or in a peripheral portion of the substrate. The size of the semiconductor chip may be greater than the sizes of the second and third semiconductor chips, and the size of the second semiconductor chip is smaller than the size of the third semiconductor chip.

The foregoing and/or other aspects and utilities of the present general inventive concept may also be achieved by providing a semiconductor package, including a semiconductor chip including a chip pad formed on a substrate including an integrated circuit, and a passivation layer to expose the chip pad, a first redistribution wiring layer connected to the chip pad and disposed above the semiconductor chip, the first redistribution wiring layer including exposed portions thereon to provide wire bonding thereto and to connect to a second semiconductor chip above there above, and a second redistribution wiring layer disposed above and connected to the first redistribution wiring layer and including exposed portions thereon to provide wire bonding thereto and to connect to a third semiconductor chip above the second chip.

The exposed portions of the first and second redistribution wiring layers can include wire bonding pads and solder pads.

BRIEF DESCRIPTION OF THE DRAWINGS

The above and other features and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
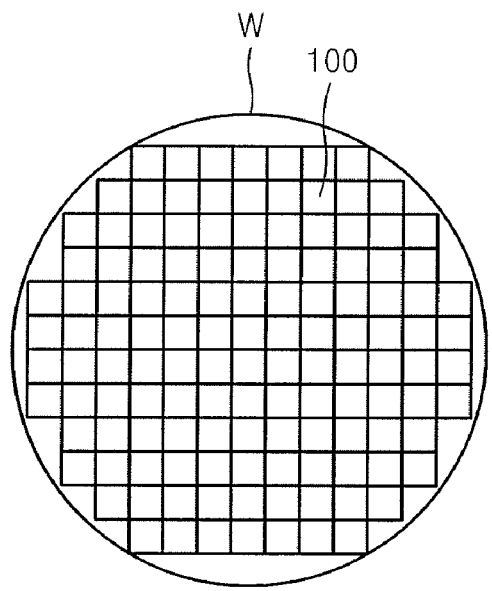
FIG. 1 is a plane view of a wafer in which semiconductor packages are arranged, according to an embodiment of the present general inventive concept.

A semiconductor package according to the present general inventive concept refers to a semiconductor package that is processed as a package type at a wafer level without undergoing a sawing process. Regarding the semiconductor package of the present general inventive concept, a number of semiconductor chips can be processed at wafer level at the same time, and thus the manufacturing cost can be reduced. In addition, since the surface area of the semiconductor chips is equal to the surface area of the semiconductor package, the semiconductor package can be more compact.

The semiconductor package according to the present general inventive concept can be formed by forming a first redistribution wiring layer having a wire bonding pad and a first solder pad in a semiconductor chip at wafer level and a second redistribution wiring layer having a second solder pad on the first redistribution wiring layer.

Accordingly, since the semiconductor package according to the present general inventive concept includes two or more redistribution wiring layers, the design flexibility of the semiconductor chips when realizing a multi-chip package can be improved. In particular, when realizing a multi-chip package by stacking semiconductor chips on the semiconductor package according to the present general inventive concept, the overall thickness of the multi-chip package can be reduced and electrical connection can be achieved at minimum distances between semiconductor chips in the multi-chip package. Thus, more semiconductor chips can be stacked in one multi-chip package.

The semiconductor package may include two or more redistribution wiring layers, but here, two redistribution wiring layers will be described for convenience of explanation. Also, the multi-chip package according to the present general inventive concept is constituted by stacking homogeneous or heterogeneous semiconductor chips. In addition, as the multi-chip package according to the present general inventive concept can realize various functions, it may also be called a system in package.

The present general inventive concept according to various embodiments will now be described more fully with reference to the accompanying drawings, in which exemplary embodiments are shown. The invention may, however, be embodied in many different forms, and should not be construed as being limited to the embodiments set forth herein; rather, these embodiments are provided so that this disclosure will be thorough and complete, and will fully convey the concept of the invention to those of ordinary skill in the art. Like reference numerals denote like elements throughout the specification.

FIG. 1 is a plane view of a wafer W in which semiconductor packages are arranged, according to an embodiment of the present general inventive concept;

In detail, a wafer W that has undergone package manufacturing processes such as a predetermined process to form an integrated circuit and a redistribution wiring formation process, includes a plurality of non-individualized semiconductor packages 100, that is, wafer level packages. By individualizing the semiconductor package 100 in the wafer W using a sawing process, etc., a unit semiconductor package is completed.

FIGS. 2 through 6 are cross-sectional views illustrating a semiconductor package and a method of manufacturing the semiconductor package, according to embodiments of the present general inventive concept.

The processes illustrated in FIGS. 2 through 6 are performed at a wafer level, and here, just one semiconductor package is illustrated for convenience. In addition, FIGS. 2 through 6 schematically illustrate the semiconductor package, but do not define the semiconductor package according to the present general inventive concept.

Figure 2:
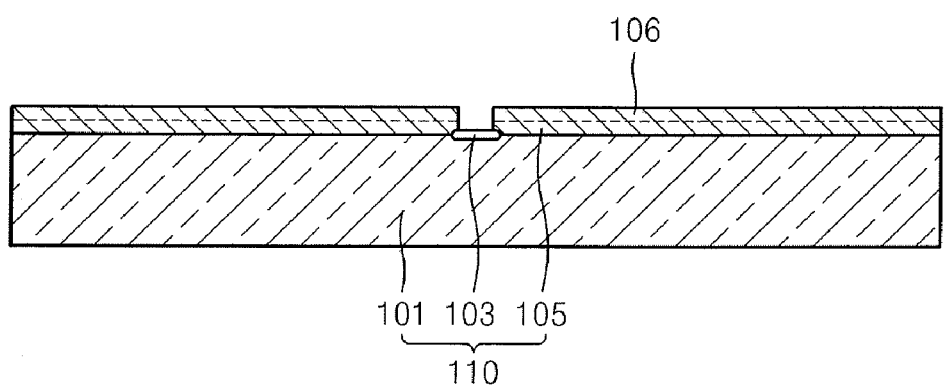
FIGS. 2 through 6 are cross-sectional views illustrating a semiconductor package and a method of manufacturing the semiconductor package, according to an embodiment of the present general inventive concept.

Referring to FIG. 2, a semiconductor chip 110 including a substrate 101 including an integrated circuit, for example, a silicon substrate, a chip pad 103 formed on the substrate 101, and a passivation layer 105 exposing the chip pad 103 is provided. The chip pad 103 may be formed in a center portion of the substrate 101 or in a peripheral portion of the substrate 101 if necessary. A redistribution wiring insulating layer 106 including an opening portion that exposes the chip pad 103 may be formed on the passivation layer 105. The redistribution wiring insulating layer 106 is formed between the passivation layer 105 and a first redistribution wiring layer which is to be formed later. However, the present general inventive concept is not limited to this, and the redistribution wiring insulating layer 106 may not be formed.

Figure 3:
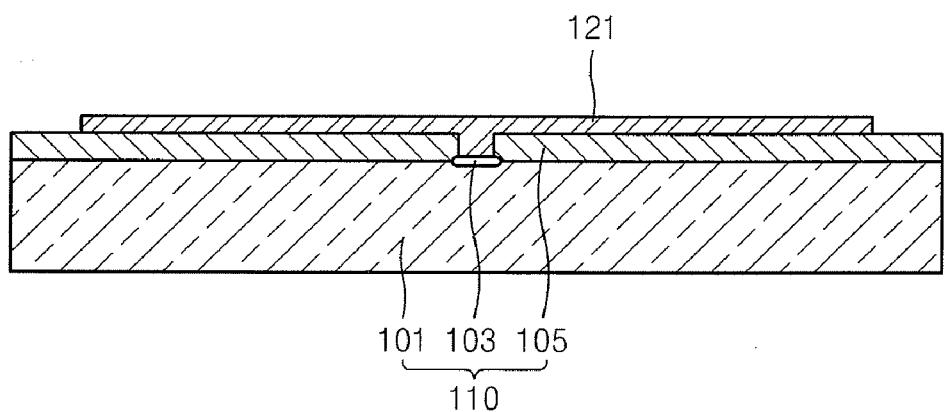

In FIG. 3, the redistribution wiring insulating layer 106 is omitted. A first redistribution wiring layer 121 which is connected to the chip pad 103 and extended on the semiconductor chip 110 is formed on the passivation layer 105. The first redistribution wiring layer 121 functions as a wire bonding pad for wire bonding. Also, the first redistribution wiring layer 121 functions as a first solder pad to connect a second semiconductor chip. Since the first redistribution wiring layer 121 should function as a wire bonding and a solder pad, it is formed of an Au layer by using an electroplating method.

Figure 4:
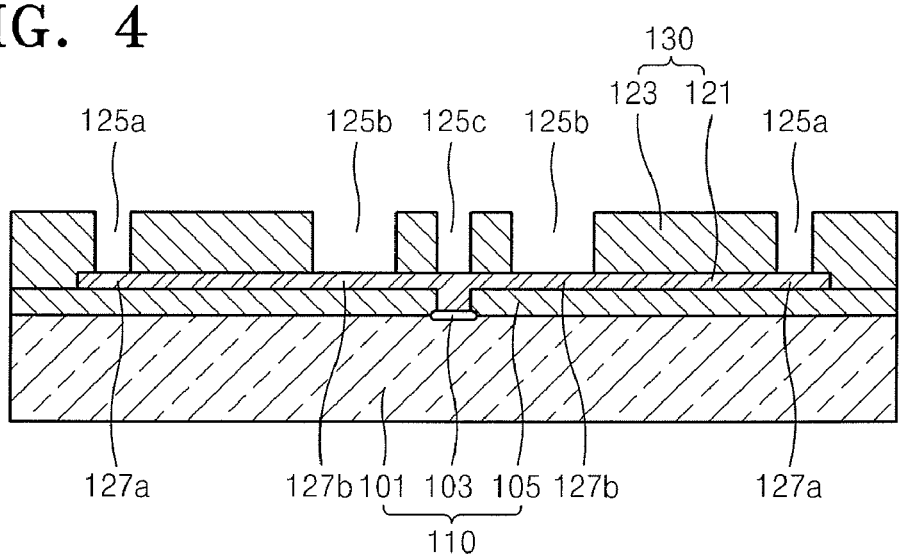

Referring to FIG. 4, a lower insulating layer 123 having a plurality of first opening portions 125a, 125b, and 125c exposing a portion of the first redistribution wiring layer 121 is formed on the first redistribution wiring layer 121. The first redistribution wiring layer 121 exposed through the first opening portions 125a and 125b includes a wire bonding pad 127a to provide wire bonding and a first solder pad 127b to connect a second semiconductor chip later.

The first redistribution wiring layer 121 exposed through the first opening portion 125c is a connection portion to be connected to a second redistribution wiring layer. The wire bonding pad 127a is formed in a peripheral portion of the semiconductor chip 110, and the first solder pad 127b is more central on the semiconductor chip 110 than the wire bonding pad 127a. Thus, the first redistribution wiring layer 121 and the lower insulating layer 123 constitute a first redistribution wiring level 130.

Figure 5:
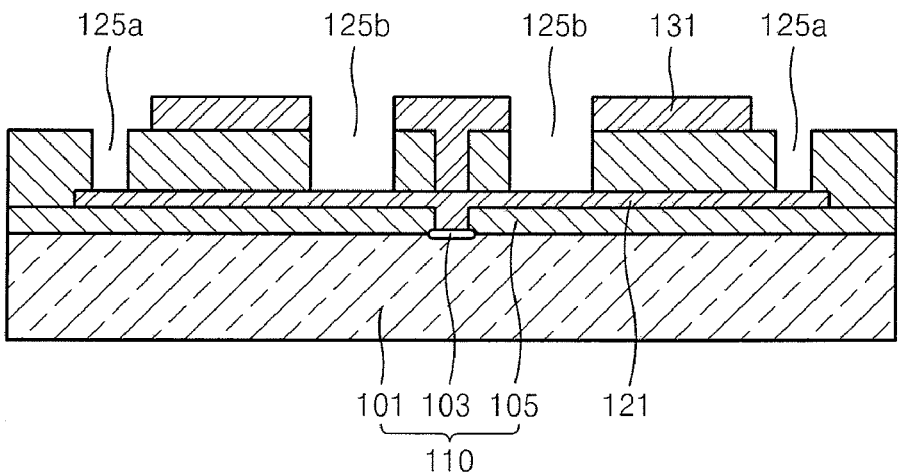

Referring to FIG. 5, a second redistribution wiring layer 131 that is connected to the first redistribution wiring layer 121 is formed on the lower insulating layer 123. The second redistribution wiring layer 131 also functions as a second solder pad to connect a third semiconductor chip. Since the second redistribution wiring layer 131 has to function as a solder pad, it can be formed of an Au layer by using an electroplating method.

Figure 6:
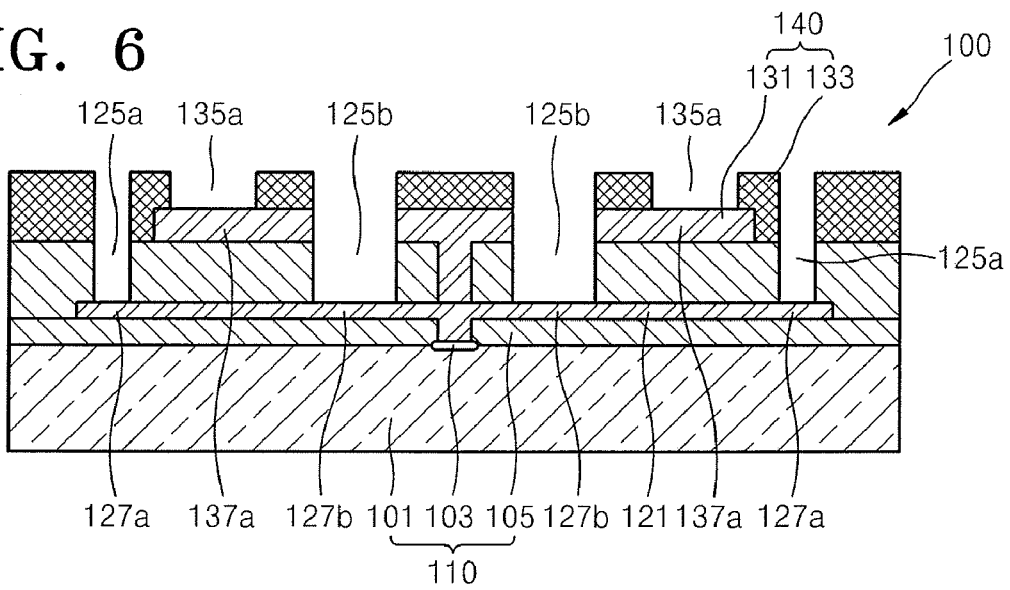

Referring to FIG. 6, an upper insulating layer 133 having a plurality of second opening portions 135a that expose a portion of the second redistribution wiring layer 131 is formed on the second redistribution wiring layer 131 using a photographic etching process. The second redistribution wiring layer 131 exposed through the second opening portions 135a includes a second solder pad 137a to connect the second redistribution wiring layer 131 to a third semiconductor chip later. The second solder pad 137a is more towards the peripheral portion of the semiconductor chip 110 than the first solder pad 127b and more central than the wire bonding pad 127a. Thus, the second redistribution wiring layer 131 and the upper insulating layer 133 constitute a third redistribution wiring level 140.

Referring to FIG. 6, again, the configuration of the semiconductor package 100 according to the current embodiment will be described. As illustrated in FIG. 6, the semiconductor package 100 includes a semiconductor chip 110 that includes a substrate 101 including an integrated circuit, a chip pad 103 formed on the substrate 101, and a passivation layer 105 exposing the chip pad 103.

In the semiconductor package 100, a first redistribution wiring layer 121 that is connected to the chip pad 103 and extends on the semiconductor chip 110, and includes a wire bonding pad 127a to provide wire bonding and a first solder pad 127b to connect the first redistribution wiring layer 121 to a second semiconductor chip, is formed. Also, the semiconductor package 100 includes a second redistribution wiring layer 131 that is electrically connected to the first redistribution wiring layer 121 above the first redistribution wiring layer 121 and includes a second solder pad 137a to connect the second redistribution wiring layer 131 to a third semiconductor chip.

As described above, the semiconductor package 100 according to the current embodiment may include two or more redistribution wiring layers 121 and 131, and thus when realizing a multi-chip package using the semiconductor package 100, the design flexibility of the semiconductor package 100 can be improved. That is, in the semiconductor package 100, the first solder pad 127b and the second solder pad 137a can be located freely according to second and third semiconductor chips which are to be stacked thereon later, thereby increasing the design flexibility of the second and third semiconductor chips.

In addition, when realizing a multi-chip package using the semiconductor package 100 in which second and third semiconductor chips are stacked, no interposer chip is required, and thus the thickness of the multi-chip package can be reduced, and electrical connection can be achieved at minimum distances between semiconductor chips in the multi-chip package, and thus more semiconductor chips can be stacked in one multi-chip package.

Hereinafter, a multi-chip package using the semiconductor package 100 according to an embodiment of the present general inventive concept will be described.

Figure 7:
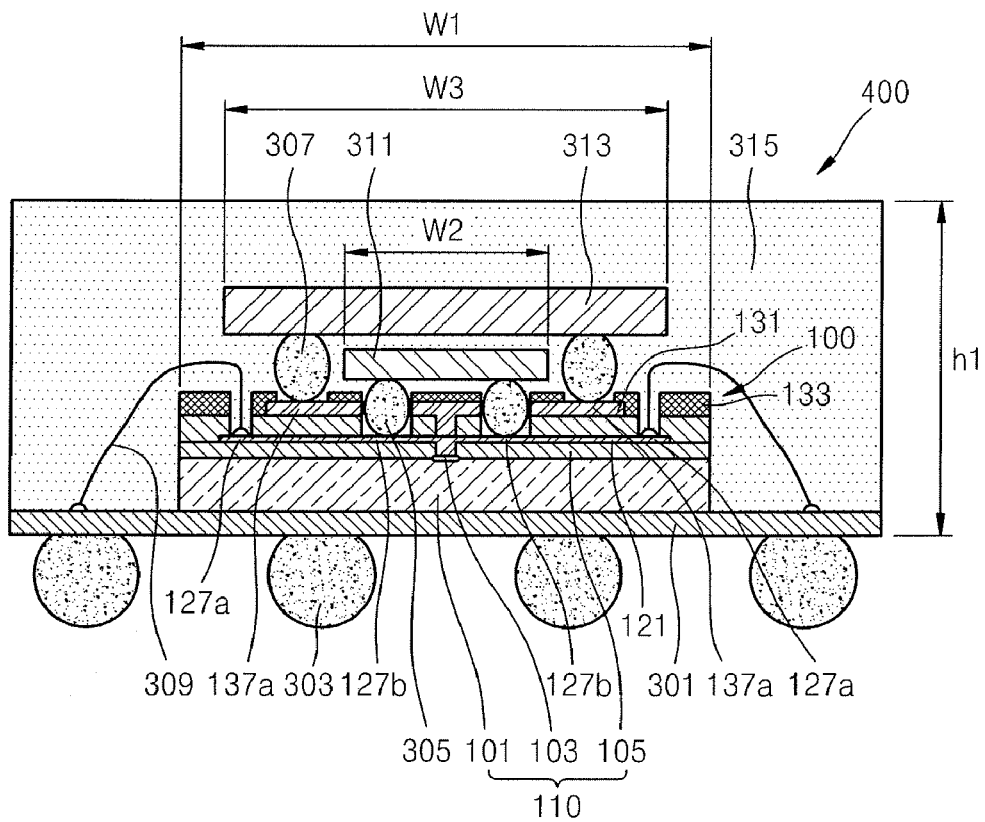
FIG. 7 is a cross-sectional view illustrating a multi-chip package according to an embodiment of the present general inventive concept.
Figure 8:
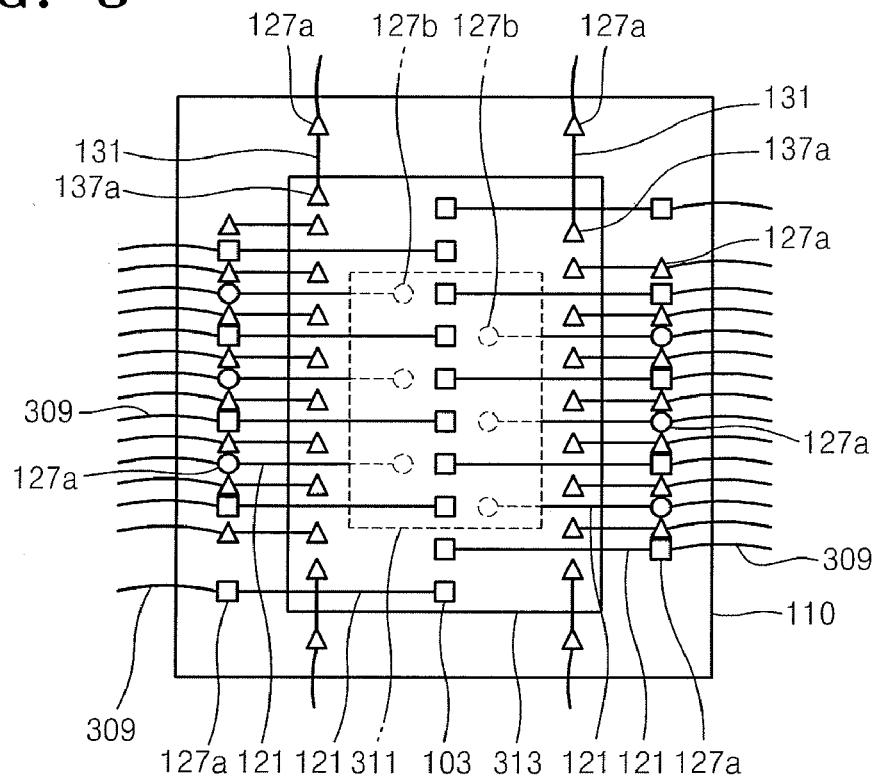
FIG. 8 is a plane view illustrating a pad lay-out of the multi-chip package of FIG. 7.

FIG. 7 is a cross-sectional view illustrating a multi-chip package 400 according to an embodiment of the present general inventive concept; and FIG. 8 is a plane view illustrating a pad lay-out of the multi-chip package 400 of FIG. 7.

In detail, FIGS. 7 and 8 are schematic illustrations describing the multi-chip package 400. First, as illustrated in FIG. 7, the multi-chip package 400 includes a wiring substrate 301, for example, a printed circuit board (PCB), that includes external connection terminals 303, and the above-described semiconductor package 100 is attached to the wiring substrate 301 using an adhesive (not shown). The semiconductor package 100 includes a first redistribution wiring layer 121 including a bonding wire 127a and a first solder pad 127b, as described above. The wire bonding pad 127a of the first redistribution wiring layer 121 and a wiring pad (not shown) of the wiring substrate 301 are connected via a bonding wire 309.

A second semiconductor chip 311 is disposed above the semiconductor chip 110 and is connected to the semiconductor chip 110 via the first solder pad 127b and a first bump 305. The second semiconductor chip 311 may be a same or different type of chip compared to the semiconductor chip 110. The size of the second semiconductor chip 311 is set to be different from that of the semiconductor chip 110.

According to the current embodiment, the size, that is, a width W2, of the second semiconductor chip 311, is smaller than a size, that is, a width W1 of the semiconductor package 100. Also, the height of the first bump 305 is set to be higher than a surface of the upper insulating layer 133. The second semiconductor chip 311 is provided to have the first bump 305 that is disposed to correspond to the first solder pad 127b, and is stacked using a flip chip process according to the position of the first solder pad 127b. The first bump 305 is designed in advance according to the first solder pad 127b of the semiconductor chip 110.

Also, the semiconductor package 100 includes the second redistribution wiring layer 131 including the second solder pad 137a as described above. A third semiconductor chip 313 is disposed above the second semiconductor chip 311 and is connected to the second semiconductor chip 311 via the second solder pad 137a and the second bump 307 of the second redistribution wiring layer 131. The third semiconductor chip 313 may be a same or different type of chip compared to the semiconductor chip 110 and the second semiconductor chip 311. The size of the third semiconductor chip 313 is set to be different from the semiconductor chip 110 and the second semiconductor chip 311.

According to the current embodiment, the size, that is, a width W3, of the third semiconductor chip 313 is smaller than the size, that is, a width W1 of the semiconductor package 100, and is greater than the size, that is, a width W2, of the second semiconductor chip 311. Also, the height of the second pump 307 is greater than the height of the second semiconductor chip 311. The third semiconductor chip 313 is provided to have the second bump 307 disposed to correspond to the second solder pad 137a, and is stacked using a flip chip process according to the position of the second solder pad 137a. The second bump 307 is designed in advance according to the second solder pad 137a of the semiconductor chip 110.

The semiconductor chips 110, 311, 313, the redistribution wiring layers 121 and 131, and the bonding wire 309 are sealed (or encapsulated) using an encapsulant 315, thereby completing the multi-chip package 400. According to the current embodiment, the size of the semiconductor chip 110, that is, the width W1, is the greatest, and the size of the second semiconductor chip 311, that is, the width W2, is smaller than the size of the third semiconductor chip 313, that is, the width W3. However, the size of the second semiconductor chip 311 or the third semiconductor chip 313 may be set differently according to the positions of the solder pad 127b or 137a of the redistribution wiring layer 121 or 131 or the chip pad 103.

As described above, the multi-chip package 400 according to the current embodiment is formed by stacking a plurality of semiconductor chips 311 and 313 in the semiconductor package 100 including two or more redistribution wiring layers 121 and 131. Accordingly, the height h1 of the whole multi-chip package 400 according to the current embodiment can be reduced, since an interposer chip is not required, and electrical connection can be achieved at minimum distances between semiconductor chips in the multi-chip package, thereby stacking more semiconductor chips in one multi-chip package.

Next, a pad layout of the multi-chip package 400 will be described with reference to FIG. 8.

As illustrated in FIG. 8, a chip pad 103 is disposed in a center portion of the semiconductor chip 110. The chip pad 103 is connected to the wire bonding pad 127a via the first redistribution wiring layer 121. The wire bonding pad 127a that is connected to the chip pad 103 is also connected to the wiring substrate (301 in FIG. 7) through the bonding wire 309.

A second semiconductor chip 311 having a smaller size than the semiconductor chip 110 is stacked above the semiconductor chip 110. That is, the second semiconductor chip 311 that is contained within the area of the semiconductor chip 110 is stacked above the semiconductor chip 110. The second semiconductor chip 311 is connected to the wire bonding pad 127a through the first solder pad 127b and the first redistribution wiring layer 121. The wire bonding pad 127a that is connected to the second semiconductor chip 311 via the first redistribution wiring layer 121 is connected to the wiring substrate (301 in FIG. 7) through the bonding wire 309.

A third semiconductor chip 313 having a larger size than the second semiconductor chip 311 is stacked above the second semiconductor chip 311. That is, the third semiconductor chip is stacked to cover the second semiconductor chip 311. The third semiconductor chip 313 is connected to the wire bonding pad 127a through the second solder pad 137a and the second redistribution wiring layer 131. The wire bonding pad 127a that is connected to the third semiconductor chip 313 and the second redistribution wiring layer 131 is connected to the wiring substrate (301 in FIG. 7) through the bonding wire 309. The pad layout of FIG. 8 is just an example, and other various layouts are also possible.

Figure 9:
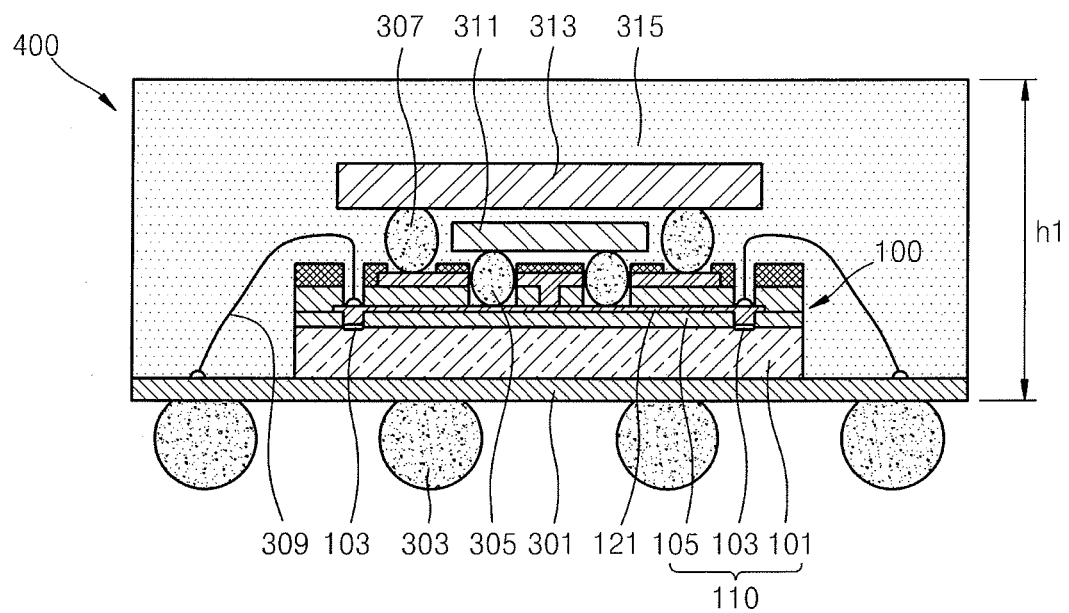
FIG. 9 is a cross-sectional view of a multi-chip package according to another embodiment of the present general inventive concept.

FIG. 9 is a cross-sectional view of a multi-chip package 400 according to another embodiment of the present general inventive concept.

In detail, the multi-chip package 400 illustrated in FIG. 9 is similar to that of FIG. 8, except that the chip pad 103 is not formed in a center portion but in peripheral portions of the semiconductor chip 110. As illustrated in FIG. 9, the multi-chip package 400 can be realized similarly to that of FIG. 8 even when the chip pad 103 is disposed in the peripheral portions of the semiconductor chip 110.

Figure 10:
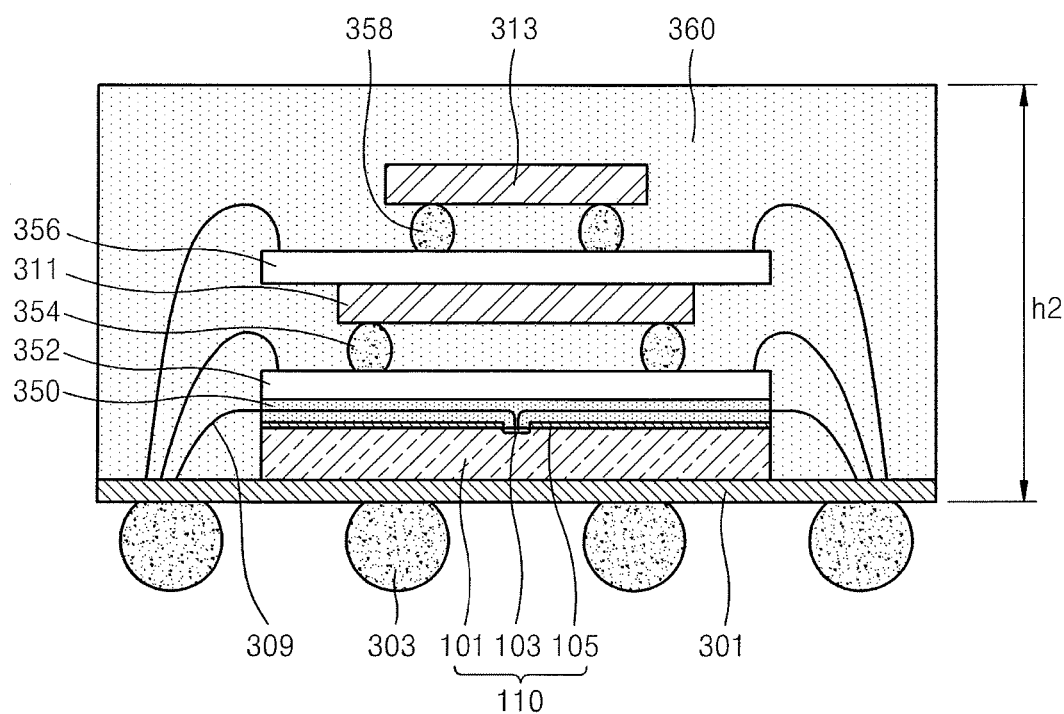
FIG. 10 is a cross-sectional view of an example of a multi-chip package to be compared with the multi-chip packages illustrated in FIGS. 7 and 9.

FIG. 10 is a cross-sectional view of an example of a multi-chip package to be compared with the multi-chip packages illustrated in FIGS. 7 and 9.

In detail, identical reference numerals of FIG. 10 to those of FIGS. 7, 8 and 9 denote the same elements. A semiconductor chip 110 is attached to the wiring substrate 301. The chip pad 103 of the semiconductor chip 110 is connected to the wiring substrate 301 using the bonding wire 309. To the semiconductor chip 110, a first interposer chip 352 is attached by interposing an adhesion layer 350. The first interposer chip 352 is also connected to the wiring substrate 301 using the bonding wire 309.

A first semiconductor chip 311 having a first bump 354 is attached to the first interposer chip 352. A second interposer chip 356 is attached to the first semiconductor chip 311. The second interposer chip 356 is also connected to the wiring substrate by using the bonding wire 309. A second semiconductor chip 313 having a second bump 358 is attached to the second interposer chip 356. As the semiconductor chip 110, the second and third semiconductor chips 311 and 313, and the first and second interposer chips 352 and 356 are sealed using an encapsulant 360, a multi-chip package is completed.

Since semiconductor chips are stacked using interposer chips for the multi-chip package of FIG. 10, a thickness h2 of the multi-chip package of FIG. 10 is larger than the thicknesses of the multi-chip packages of FIGS. 7 and 9. Accordingly, as the wiring length of the multi-chip package of FIG. 10 has a high probability of cutting bonding wires compared to those of FIGS. 8 and 9, there is a limit to the number of semiconductor chips that can be stacked in one multi-chip package.

Hereinafter, various application examples using the multi-chip package 400 according to the current embodiment of the present invention will be described.

Figure 11:
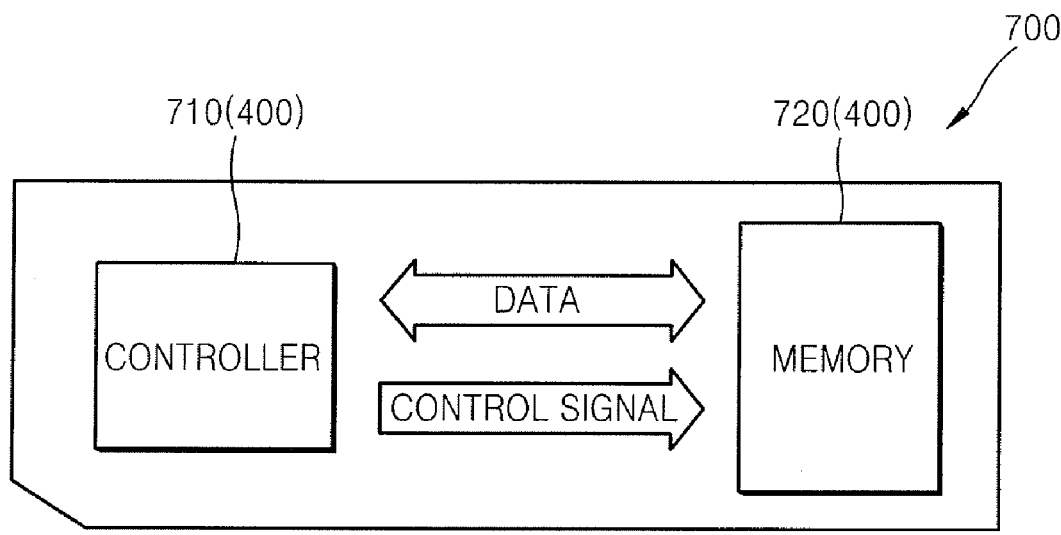
FIG. 11 is a schematic view of a card in which the multi-chip package according to embodiments of the present general inventive concept is used.

FIG. 11 is a schematic view of a card 700 in which the multi-chip package 400 according to the current embodiment is used.

In detail, the multi-chip package 400 according to the current embodiment can be applied to a card 700. Examples of the card 700 include a multimedia card (MMC), a secure digital card (SD), etc. The card 700 includes a controller 710 and a memory 720. Examples of the memory 720 include a flash memory, a phase-change random access memory device (PRAM), a random access memory (RAM), or other types of non-volatile memories. A control signal is transmitted from the controller 710 to the memory 720, and data is transmitted or received between the controller 710 and memory 720.

Here, the multi-chip packages 400 (of FIGS. 7 and 9) are employed as the controller 710 and the memory 720 constituting the card 700 according to the current embodiment of FIG. 11. In this case, the card 700 can increase the memory capacity and include a controller 710 having various functions. Also, as the card 700 includes the multi-chip package 400 that does not include an interposer chip, the thickness of the card 700 can be reduced and the wiring length can also be reduced, thereby preventing a decrease in reliability which may be caused by cutting the bonding wire.

Figure 12:
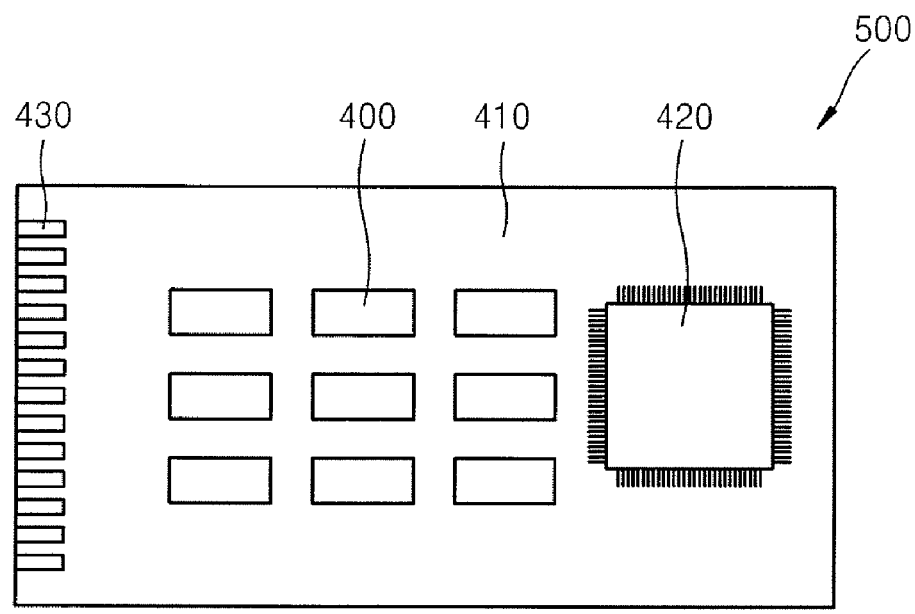
FIG. 12 is a schematic view of a package module in which the multi-chip package according to embodiments of the present general inventive concept is used.

FIG. 12 is a schematic view of a package module 500 in which the multi-chip package 400 according to the current embodiment is used.

In detail, the multi-chip package 400 according to the current embodiment can be applied to a package module 500. In the package module 500, a plurality of multi-chip packages 400 are attached to a module substrate 410. A quad flat package (QFP) type package 400 is attached to one side of the package module 500, and external connection terminals are disposed on the other side of the package module 500. The multi-chip package 400 according to the current embodiment of the present invention is not limited to FIG. 12 and may also be applied to other various modules.

Figure 13:
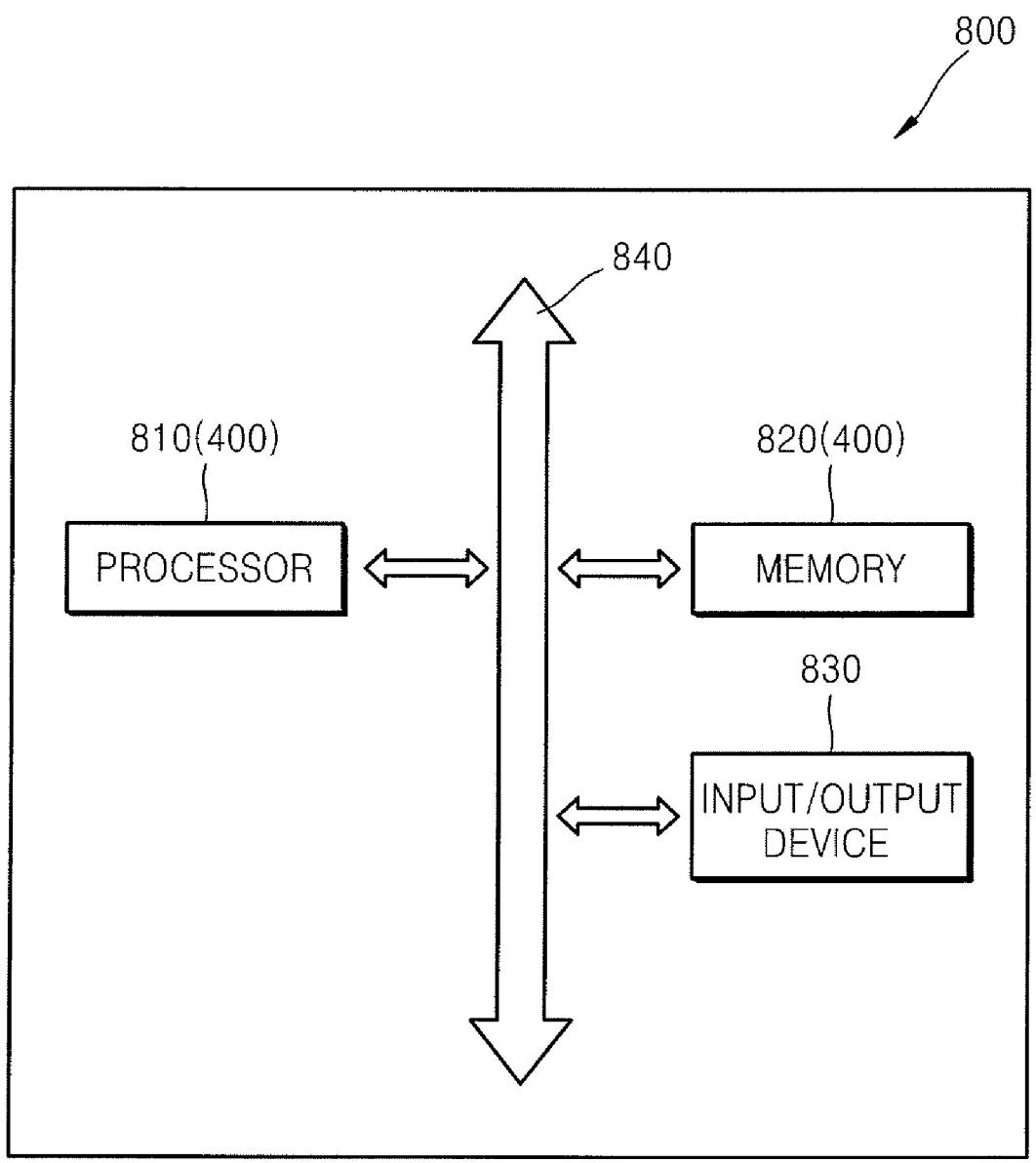
FIG. 13 is a schematic view of an electronic system in which the multi-chip package according to embodiments of the present general inventive concept is used.

FIG. 13 is a schematic view of an electronic system 800 in which the multi-chip package 400 according to the current embodiment is used.

In detail, examples of the electronic system 800 include a computer, a mobile phone, an mpeg-1 audio layer 3 (MP3) player, a navigator, etc. The electronic system 800 includes a processor 810, a memory 820, and an input/output device 830. A control signal or data is transmitted or received between the processor 810 and the memory 820 or the input/output device 830 by using a communication channel 840.

In this electronic system 800, the multi-chip package 400 is implemented as the processor 810 and the memory 820. Thus, the electronic system 800 has increased reliability due to the multi-chip package 400 which does not include an interposer chip. Accordingly, the reliability of the electronic system 800 according to the current embodiment is increased.

In the semiconductor package according to various embodiments of the present general inventive concept, a first redistribution wiring layer having a wire bonding and a first solder pad is formed on a semiconductor chip at wafer level, and a second redistribution wiring layer having a second solder pad is formed on the first redistribution wiring layer. Accordingly, as two or more redistribution wiring layers are formed in the semiconductor package according to the present general inventive concept, the design flexibility of the semiconductor chips can be improved.

Also, when a multi-chip package is realized by stacking semiconductor chips in the semiconductor package including two or more redistribution wiring layers, no interposer chip is required, and thus the thickness of the multi-chip package can be reduced and (electrical?) connection can be achieved at minimum distances between semiconductor chips in the semiconductor package, which enables the stacking of more semiconductor chips in one multi-chip package.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A semiconductor package comprising:
    a semiconductor chip that includes a chip pad formed on a substrate including an integrated circuit, and a passivation layer to expose the chip pad;
    a first redistribution wiring layer that is connected to the chip pad and extends on the semiconductor chip and includes a wire bonding pad to provide wire bonding and a first solder pad to connect the first redistribution wiring layer to a second semiconductor chip; and
    a second redistribution wiring layer that is connected to the first redistribution wiring layer on the first redistribution wiring layer and includes a second solder pad to connect the second redistribution wiring layer to a third semiconductor chip, the second solder pad being formed more towards a peripheral portion of the semiconductor chip than the first solder pad and more central than the wire bonding pad.

2. The semiconductor package of claim 1, further comprising:
    a redistribution wiring insulating layer that includes an opening portion exposing the chip pad to provide redistribution wiring, and is formed between the passivation layer and the first redistribution wiring layer.

3. The semiconductor package of claim 1, wherein a lower insulating layer exposing the wire bonding pad and the first solder pad is further formed on the first redistribution wiring layer.

4. The semiconductor package of claim 1, wherein an upper insulating layer exposing the second solder pad is further formed on the second redistribution wiring layer.

5. The semiconductor package of claim 1, wherein the first redistribution wiring layer and the second redistribution wiring layer are formed of Au layers.

6. The semiconductor package of claim 1, wherein the chip pad is formed in a center portion or a peripheral portion of the substrate.

7. A semiconductor package comprising:
a semiconductor chip that includes a chip pad formed on a substrate including an integrated circuit, and a passivation layer exposing the chip pad;
a first redistribution wiring layer connected to the chip pad and extends on the semiconductor chip;
a lower insulating layer formed on the first redistribution wiring layer and including a plurality of first opening portions exposing respective portions of the first redistribution wiring layer;
a second redistribution wiring layer connected to the first redistribution wiring layer and formed on the lower insulating layer; and
an upper insulating layer formed on the second redistribution wiring layer and including a plurality of second opening portions exposing respective portions of the second redistribution wiring layer and a plurality of third opening portions corresponding with the plurality of first opening portions to expose respective portions of the first redistribution wiring layer.

8. The semiconductor package of claim 7, wherein the first redistribution wiring layer exposed through the first opening portions includes a wire bonding pad to provide wire bonding and a first solder pad to connect the first redistribution wiring layer to a second semiconductor chip.

9. The semiconductor package of claim 8, wherein the wire bonding pad is formed in a peripheral portion of the semiconductor chip, and the first solder pad is formed in a portion more central than the wire bonding pad.

10. The semiconductor package of claim 8, wherein the second redistribution wiring layer exposed through one of the second opening portions is a second solder pad to connect the second redistribution wiring layer to the third semiconductor chip.

11. The semiconductor package of claim 10, wherein the second solder pad is formed more towards the peripheral portion of the semiconductor chip than the first solder pad and more central than the wire bonding pad.

12. A multi-chip package, comprising:
a wiring substrate;
a first semiconductor chip that is attached to the wiring substrate, and includes a chip pad formed on a substrate including an integrated circuit, and a passivation layer exposing the chip pad;
a first redistribution wiring layer that is connected to the chip pad and extends on the semiconductor chip and includes a wire bonding pad and a first solder pad;
a bonding wire connecting the wire bonding pad of the first redistribution wiring layer and a wiring pad of the wiring substrate;
a second redistribution wiring layer that is connected to the first redistribution wiring layer above the first redistribution wiring layer and has a second solder pad formed more towards a peripheral portion of the first semiconductor chip than the first solder pad and more central than the wire bonding pad;
a second semiconductor chip that is disposed above the first semiconductor chip and connected to the first semiconductor chip through a first bump that is disposed in a position corresponding to the first solder pad of the first redistribution wiring layer;
a third semiconductor chip disposed above the second semiconductor chip and connected to the second semiconductor chip through a second bump in a position corresponding to the second solder pad of the second redistribution wiring layer; and
an encapsulant sealing the semiconductor chips, the redistribution wiring layers, and the bonding wire.

13. The multi-chip package of claim 12, wherein a redistribution wiring insulating layer including an opening portion exposing the chip pad to provide redistribution wiring is further formed between the passivation layer and the first redistribution wiring layer.

14. The multi-chip package of claim 12, wherein a lower insulating layer is further formed on the first redistribution wiring layer, which exposes the wire bonding pad and the first solder pad.

15. The multi-chip package of claim 12, wherein an upper insulating layer is formed on the second redistribution wiring layer, which exposes the second solder pad.

16. The multi-chip package of claim 12, wherein the sizes of the second and third semiconductor chips are different from the size of the first semiconductor chip.

17. A multi-chip package comprising:
a wiring substrate;
a first semiconductor chip includes an integrated circuit, and a passivation layer exposing the chip pad;
a first redistribution wiring layer that is connected to the chip pad and extends on the semiconductor chip;
a lower insulating layer that is formed on the first redistribution wiring layer, and forms a wire bonding pad and a first solder pad in a plurality of first opening portions which expose portions of the first redistribution wiring layer;
a second redistribution wiring layer that is connected to the first redistribution wiring layer and is formed on the lower insulating layer;
an upper insulating layer that is formed on the second redistribution wiring layer and forms a plurality of second solder pads in a plurality of second opening portions which expose portions of the second redistribution wiring layer and a plurality of third opening portions corresponding with the plurality of first opening portions to expose respective portions of the first redistribution wiring layer;
a bonding wire that connects the wire bonding pad and a wiring pad of the wiring substrate;
a second semiconductor chip that is formed above the first semiconductor chip and is connected to the first semiconductor chip through a first bump that is disposed in a position corresponding to the first solder pad;
a third semiconductor chip that is disposed above the second semiconductor chip and is connected to the second semiconductor chip through a second bump that is disposed in a position corresponding to one of the second solder pads; and
an encapsulant sealing the semiconductor chips, the redistribution wiring layers, and the bonding wire.

18. The multi-chip package of claim 17, wherein the wire bonding pad is in a peripheral portion of the first semiconductor chip, and the first solder pad is more central than the wire bonding pad in the first semiconductor chip.

19. The multi-chip package of claim 17, wherein the chip pad is formed in a center portion or in a peripheral portion of a substrate of the first semiconductor chip.

20. The multi-chip package of claim 17, wherein the size of the first semiconductor chip is greater than the sizes of the second and third semiconductor chips, and the size of the second semiconductor chip is smaller than the size of the third semiconductor chip.

21. A semiconductor package, comprising:
a first semiconductor chip including a chip pad formed on a substrate including an integrated circuit, and a passivation layer to expose the chip pad;
a first redistribution wiring layer connected to the chip pad and disposed above the semiconductor chip, the first redistribution wiring layer including exposed portions thereon to provide wire bonding thereto and to connect to a second semiconductor chip above the first semiconductor chip; and
a second redistribution wiring layer disposed above and connected to the first redistribution wiring layer and including exposed portions thereon to provide wire bonding thereto and to connect to a third semiconductor chip above the second semiconductor chip.

22. The semiconductor package of claim 21, wherein the exposed portions of the first and second redistribution wiring layers includes wire bonding pads and solder pads.

23. A semiconductor package comprising:
a first semiconductor chip that includes a chip pad formed on a substrate including an integrated circuit, and a passivation layer exposing the chip pad;
a first redistribution wiring layer connected to the chip pad and extending on the semiconductor chip;
a lower insulating layer formed on the first redistribution wiring layer and including a plurality of first opening portions exposing respective portions of the first redistribution wiring layer;
a second redistribution wiring layer connected to the first redistribution wiring layer and formed on the lower insulating layer; and
an upper insulating layer formed on the second redistribution wiring layer and including a plurality of second opening portions exposing respective portions of the second redistribution wiring layer,
wherein the second redistribution wiring layer exposed through one of the second opening portions is a second solder pad to connect the second redistribution wiring to a second semiconductor chip, and
wherein the second solder pad is formed more towards a peripheral portion of the first semiconductor chip than the first solder pad and more central than a wiring bonding pad.

24. The semiconductor package of claim 23, wherein the first redistribution wiring layer exposed through the first opening portions includes the wire bonding pad to provide wire bonding and a first solder pad to connect the first redistribution wiring layer to a third semiconductor chip.

25. The semiconductor package of claim 23, wherein the wire bonding pad formed in a peripheral portion of the first semiconductor chip, and the first solder pad is formed in a portion more central than the wire bonding pad.

* * * * *